(12) United States Patent
Leobandung

(10) Patent No.: US 9,647,091 B2
(45) Date of Patent: May 9, 2017

(54) ANNEALED METAL SOURCE DRAIN OVERLAPPING THE GATE

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/701,721

(22) Filed: May 1, 2015

(65) Prior Publication Data

US 2016/0322475 A1 Nov. 3, 2016

(51) Int. Cl.
| | |
|---|---|
| *H01L 21/336* | (2006.01) |
| *H01L 29/66* | (2006.01) |
| *H01L 21/02* | (2006.01) |
| *H01L 29/78* | (2006.01) |
| *H01L 29/423* | (2006.01) |

(52) U.S. Cl.
CPC .... *H01L 29/66795* (2013.01); *H01L 29/4238* (2013.01); *H01L 29/665* (2013.01); *H01L 29/66545* (2013.01); *H01L 29/785* (2013.01); *H01L 29/7839* (2013.01)

(58) Field of Classification Search
CPC . H01L 29/45; H01L 29/66795; H01L 29/665; H01L 21/28518; H01L 21/28044; H01L 21/28052; H01L 21/28097
See application file for complete search history.

(56) References Cited

U.S. PATENT DOCUMENTS

| | | | |
|---|---|---|---|
| 4,795,717 | A | 1/1989 | Okamura |
| 6,274,446 | B1 | 8/2001 | Agnello et al. |
| 6,737,710 | B2 | 5/2004 | Cheng et al. |
| 7,176,537 | B2 | 2/2007 | Lee et al. |
| 7,879,675 | B2 | 2/2011 | Radosavljevic et al. |
| 8,482,084 | B2 | 7/2013 | Khater et al. |

(Continued)

FOREIGN PATENT DOCUMENTS

WO 2015047264 A1 4/2015

OTHER PUBLICATIONS

Irisawa et al., "High Mobility p-n Junction-less InGaAs—OI Tri-gate nMOSFETs with Metal SourceIDrain for Ultra-low-power CMOS Applications", 2012 IEEE, Collaborative Research Team Green Nanoelectronics Center (GNC), AIST, Onogawa 16-1, Tsukuba, Ibaraki 305-8569, Japan, pp. 1-2.

(Continued)

*Primary Examiner* — Thomas L Dickey
*Assistant Examiner* — Damon Hillman
(74) *Attorney, Agent, or Firm* — Michael P. O'Keefe

(57) ABSTRACT

A method of forming a field effect transistor is provided. The method of forming a field effect transistor may include forming a dummy gate perpendicular to and covering a channel region of a semiconductor fin, such that a source drain region of the semiconductor fin remains uncovered, depositing a metal layer above and in direct contact with a sidewall of the dummy gate, and above and in direct contact with a top and a sidewall of the source drain region, and forming a metal silicide source drain in the source drain region by annealing the metal layer and the semiconductor fin, such that the metal silicide source drain overlaps the dummy gate.

19 Claims, 9 Drawing Sheets

(56) References Cited

U.S. PATENT DOCUMENTS

| | | | |
|---|---|---|---|
| 2010/0167475 A1* | 7/2010 | Nara | H01L 29/785 438/157 |
| 2011/0156107 A1* | 6/2011 | Bohr | H01L 21/76831 257/288 |
| 2012/0187505 A1 | 7/2012 | Guo et al. | |
| 2013/0200443 A1 | 8/2013 | Lavoie et al. | |
| 2013/0299895 A1 | 11/2013 | Oxland et al. | |
| 2014/0206167 A1* | 7/2014 | Wu | H01L 29/78 438/285 |
| 2015/0064854 A1 | 3/2015 | Leobandung | |

OTHER PUBLICATIONS

Kim et al., "Self-aligned metal SourcelDrain InxGa1—xAs n-MOSFETs using Ni—InGaAs alloy", 2010 IEEE, pp. 26.6.1-26.6.4, IEEE International Electron Devices Meeting (IEDM).

Kim et al., "High-Performance InAs-On-Insulator n-MOSFETs With Ni—InGaAs S/D Realized by Contact Resistance Reduction Technology", IEEE Transactions on Electron Devices, vol. 60, No. 10, Oct. 2013, pp. 3342-3350.

Zhang et al., "In0.7Ga0.3As Channel n-MOSFETs with a Novel Self-Aligned Ni—InGaAs Contact formed using a Salicide-like Metallization Process", International Symposium on VLSI Technology, Systems and Applications (VLSI-TSA), 2011, pp. 1-2.

Zhang et al., "A Gate-Last In0.53Ga0.47As Channel FinFET with Molybdenum Source/Drain Contacts", Proceedings of the European Solid-State Device Research Conference, (ESSDERC), 2012, pp. 177-180.

Larson et al., "Overview and Status of Metal S/D Schottky-Barrier MOSFET Technology", IEEE Transactions on Electron Devices, vol. 53, No. 5, May 2006, pp. 1048-1058.

Livi et al., "A Hybrid FinFET-based Biosensor with Integrated Readout Capability", Procedia Engineering vol. 47, (2012), pp. 821-824.

Han et al., "Graphene radio frequency receiver integrated circuit", Nature Communications, Article, Published Jan. 30, 2014, pp. 1-6.

* cited by examiner

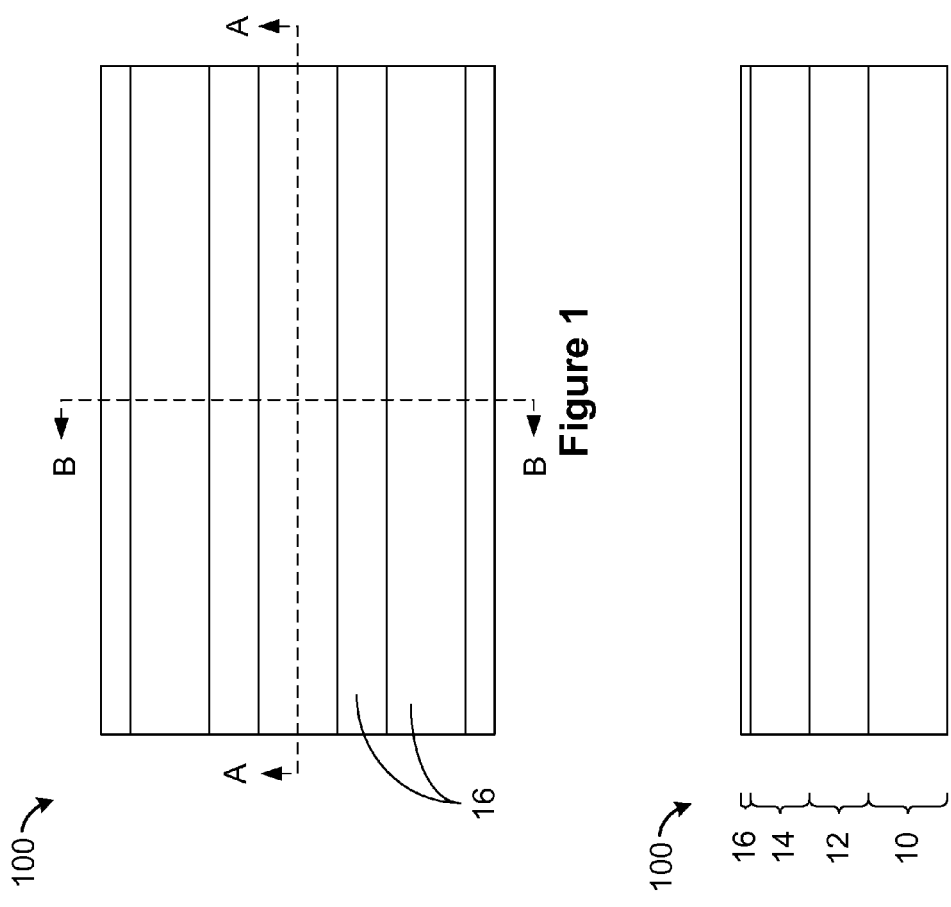

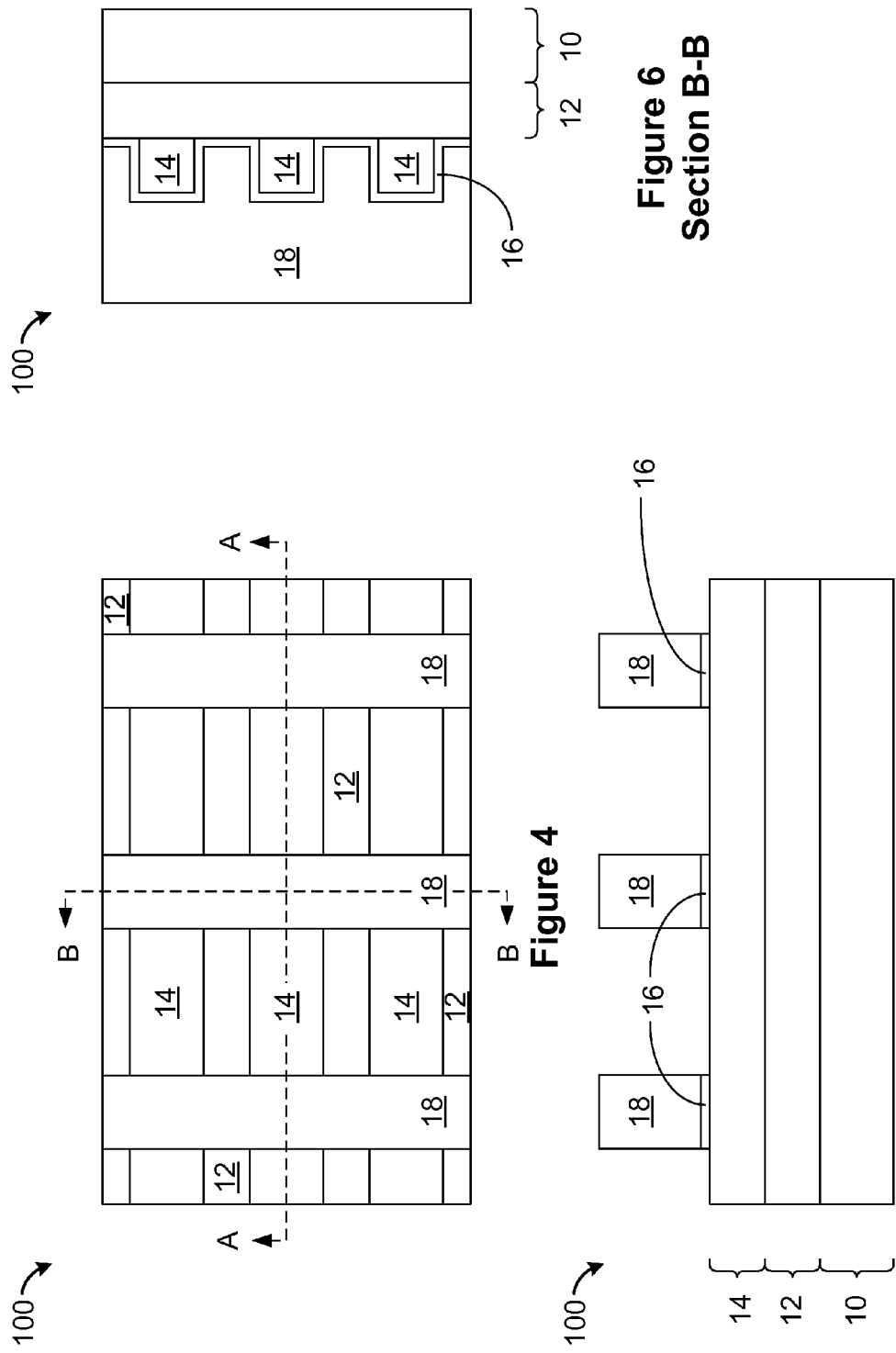

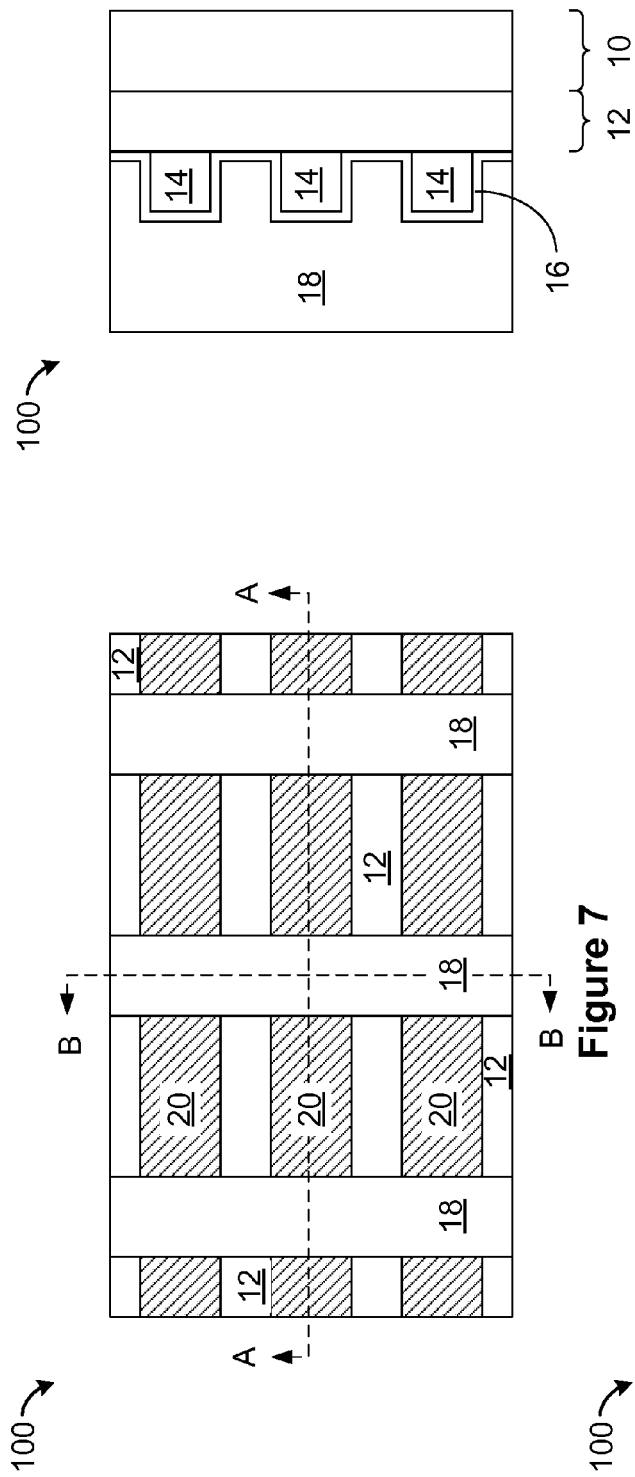
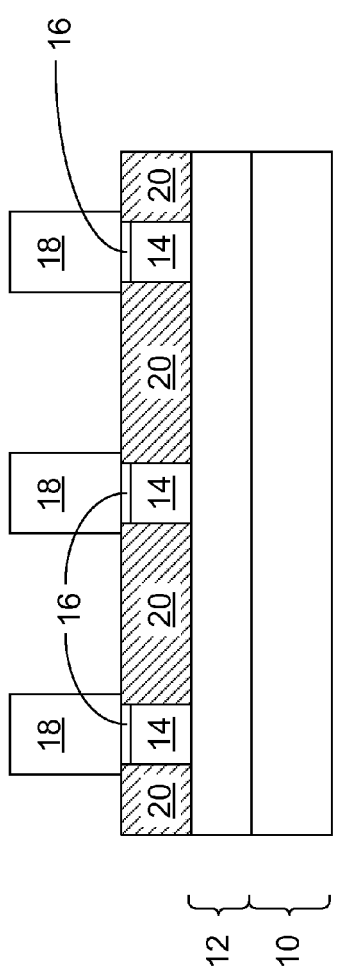
Figure 7
Figure 8
Section A-A
Figure 9
Section B-B

Section B-B

Section A-A

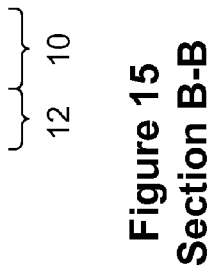
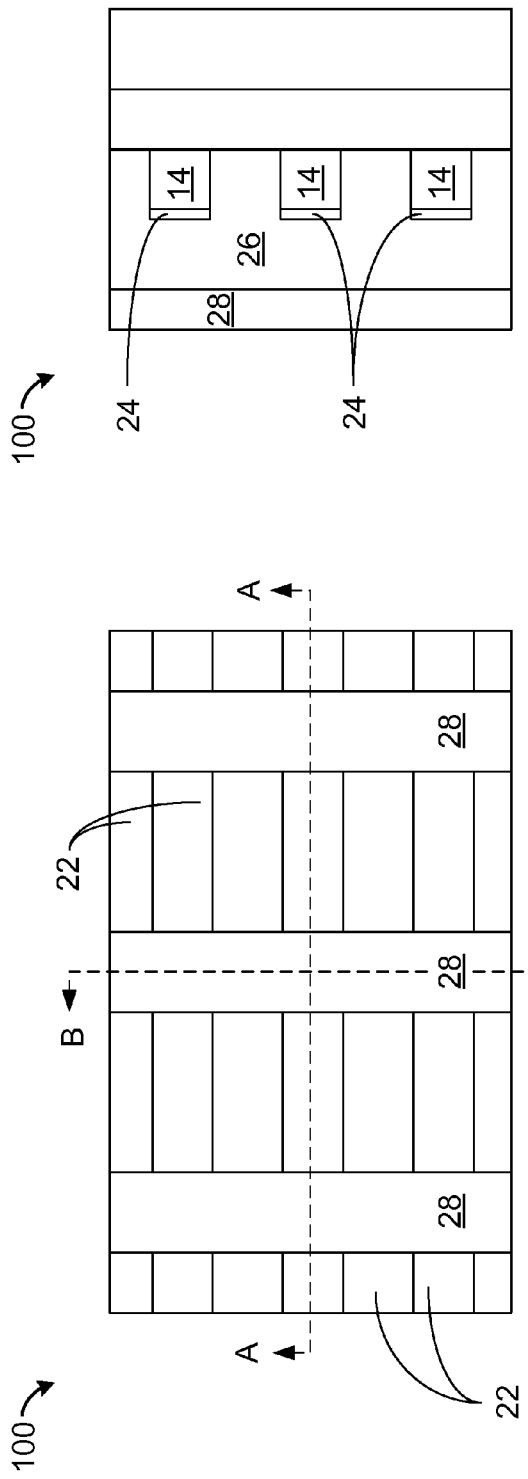
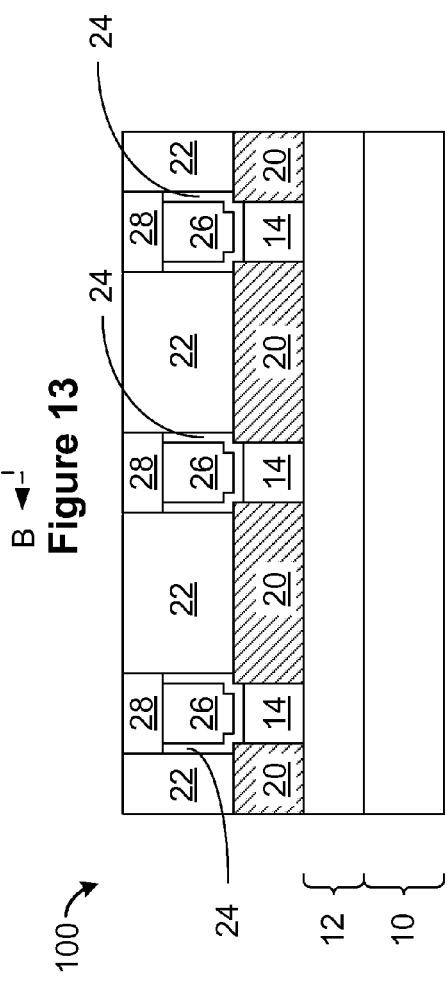

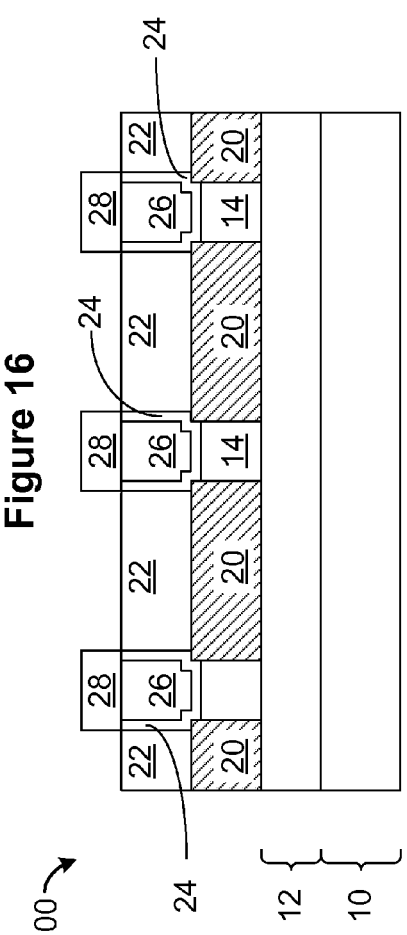
Figure 18
Section B-B
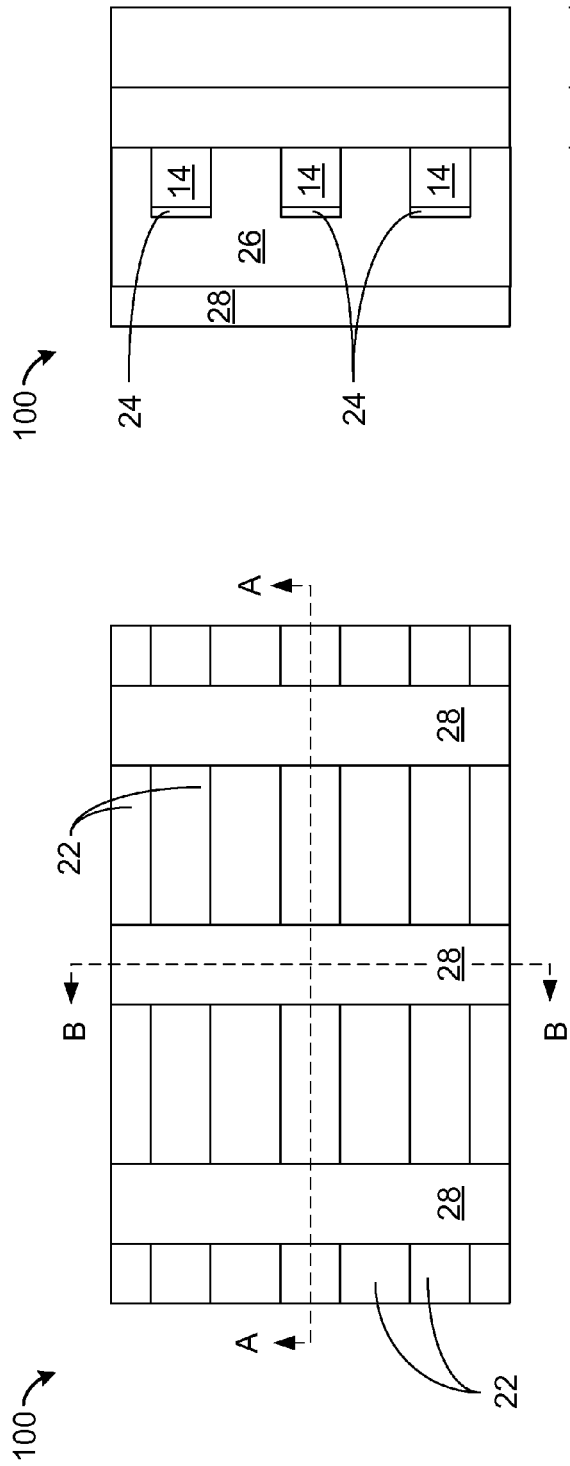
Figure 16
Figure 17
Section A-A

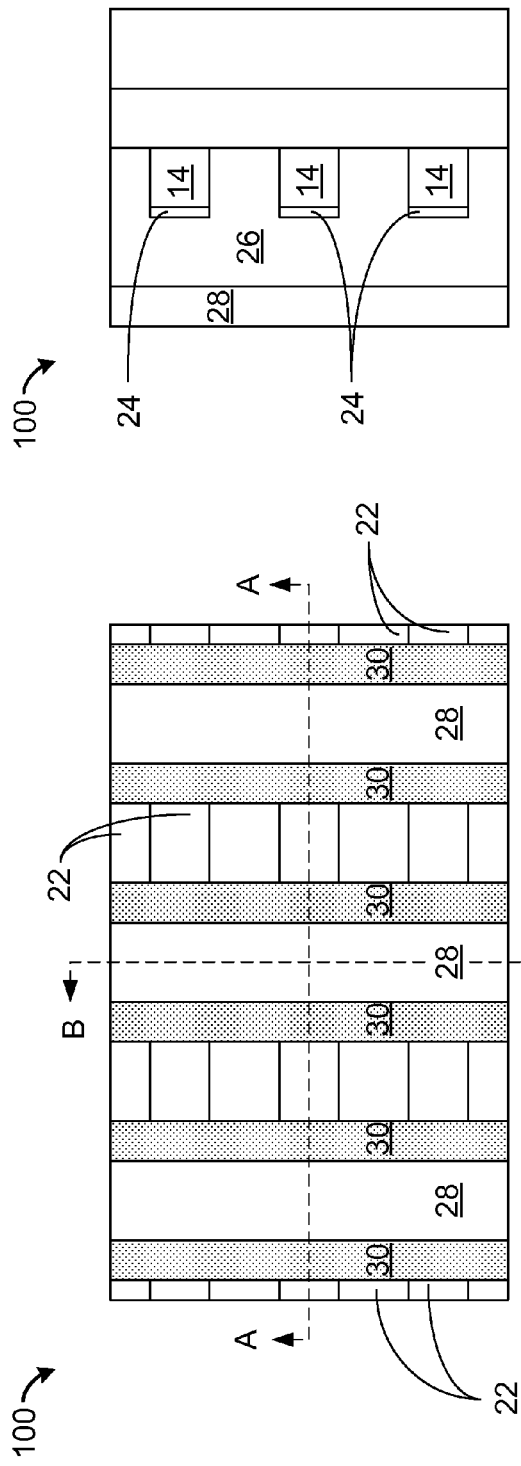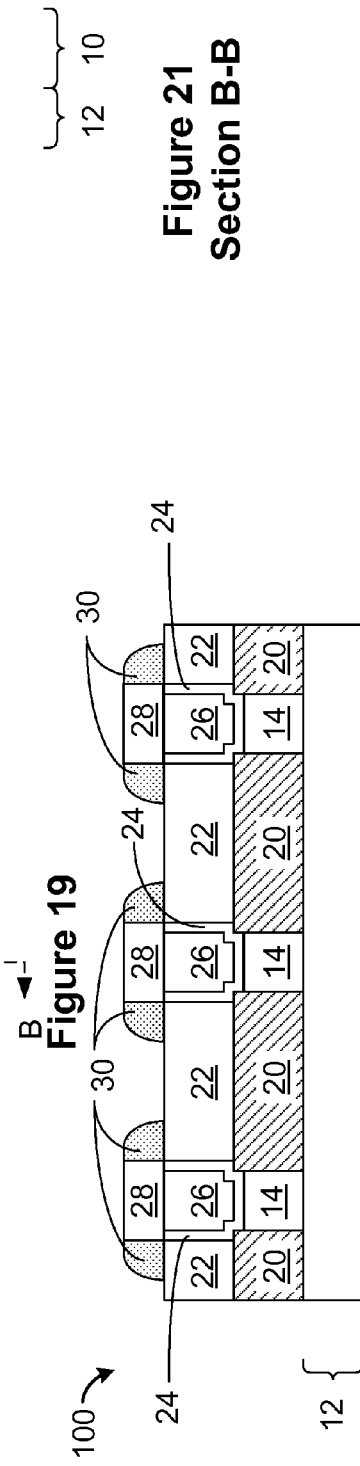
Figure 21
Section B-B
Figure 19
Figure 20
Section A-A

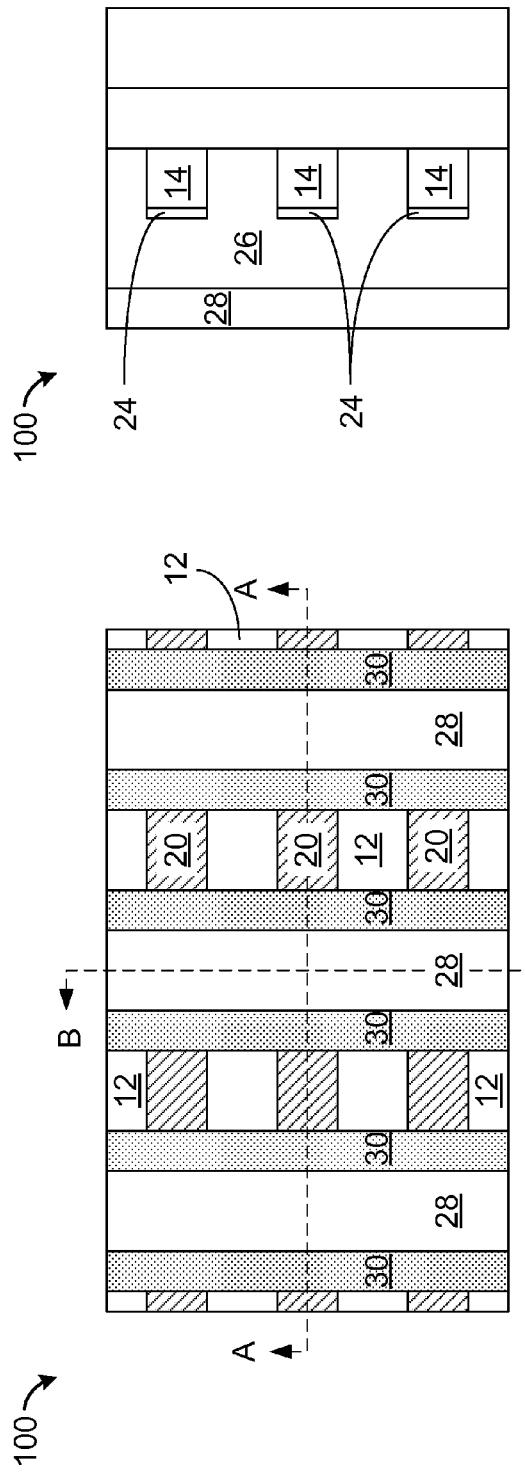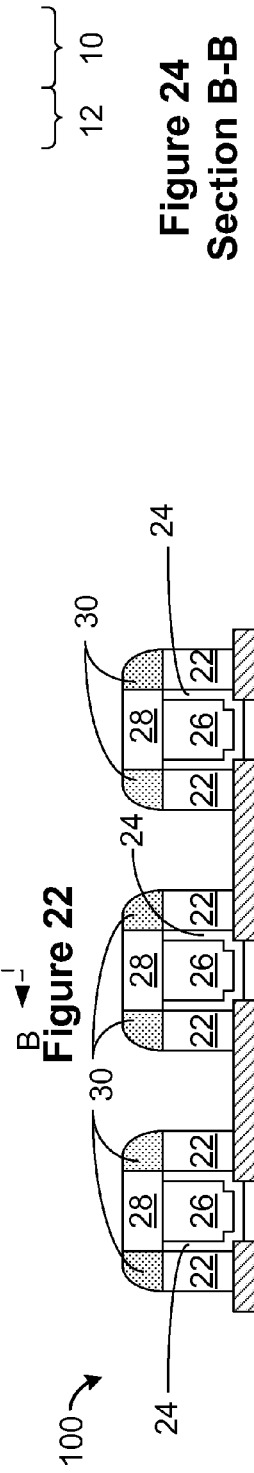
Figure 22
Figure 23 Section A-A
Figure 24 Section B-B

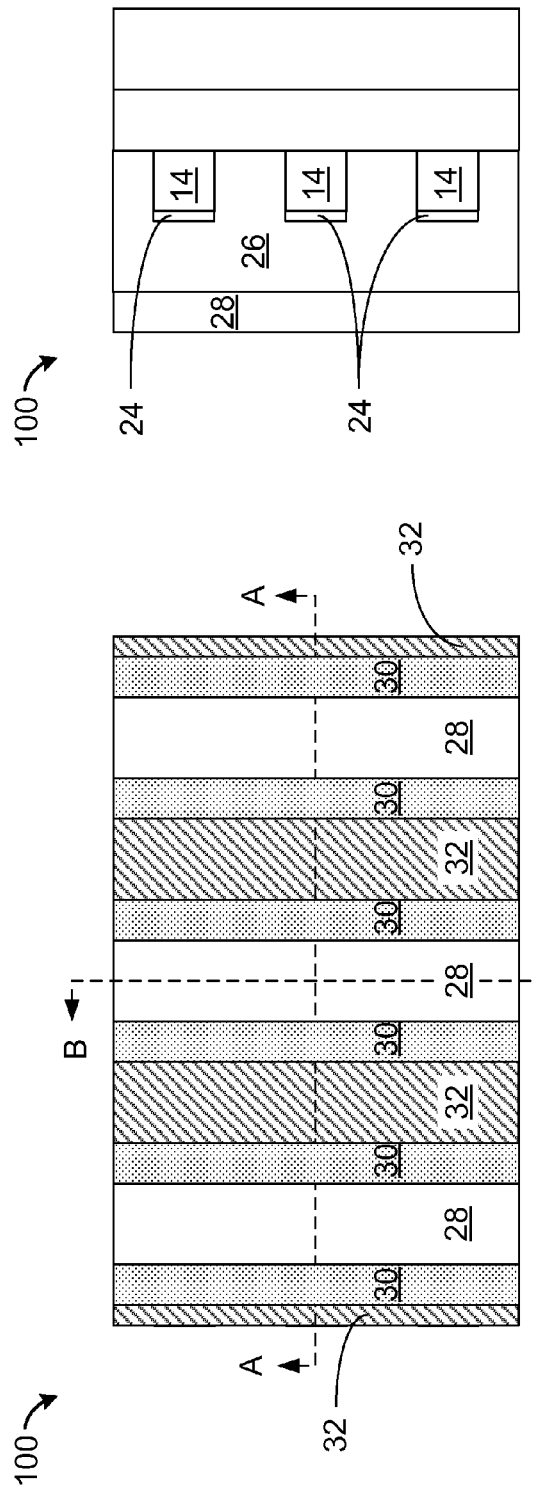
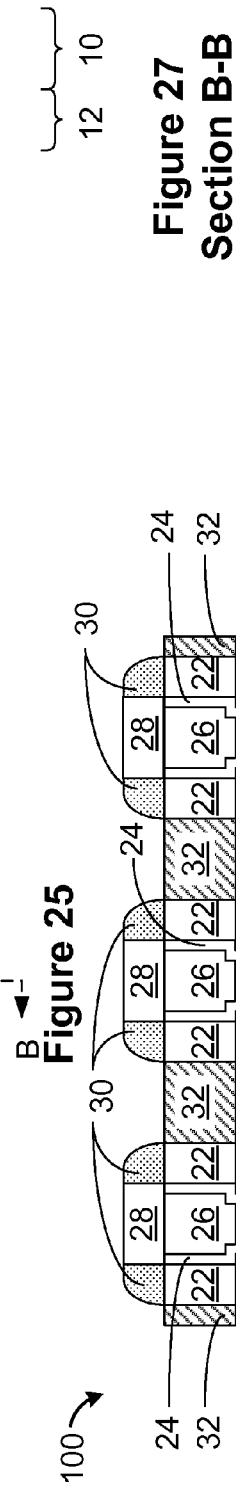
Figure 25
Figure 26 Section A-A
Figure 27 Section B-B

ANNEALED METAL SOURCE DRAIN OVERLAPPING THE GATE

BACKGROUND

The present invention generally relates to semiconductor manufacturing, and more particularly to fin field effect transistor devices (FinFET) that have a source drain with proper overlap.

Complementary Metal-oxide-semiconductor (CMOS) technology is commonly used for fabricating field effect transistors (FET) as part of advanced integrated circuits (IC), such as CPUs, memory, storage devices, and the like. Most common among these may be metal-oxide-semiconductor field effect transistors (MOSFET), in which a gate structure may be energized to create an electric field in an underlying channel region of a substrate, by which charge carriers are allowed to travel through the channel region between a source region and a drain region of the substrate. The portion of a fin not covered by the gate structure may define a source drain region of the semiconductor device. The length of the channel region directly affects the functionality of the FET. As ICs continue to scale downward in size, an overlap may be needed between the gate and the source drain region.

SUMMARY

According to one embodiment of the present invention, a method of forming a field effect transistor is provided. The method of forming a field effect transistor may include forming a dummy gate perpendicular to and covering a channel region of a semiconductor fin, such that a source drain region of the semiconductor fin remains uncovered, depositing a metal layer above and in direct contact with a sidewall of the dummy gate, and above and in direct contact with a top and a sidewall of the source drain region, and forming a metal silicide source drain in the source drain region by annealing the metal layer and the semiconductor fin, such that the metal silicide source drain overlaps the dummy gate.

According to another embodiment, a method of forming a field effect transistor is provided. The method of forming a field effect transistor may include forming a dummy gate perpendicular to and covering a channel region of a silicon fin, such that a source drain region of the silicon fin remains uncovered, depositing a metal layer in direct contact with a top and a sidewall of the dummy gate, and in direct contact with a top and a sidewall of the source drain region, annealing the metal layer and the source drain region, causing silicon from the source drain region to react with the metal layer, forming a metal silicide, such that a portion of the metal silicide extends beneath the dummy gate creating an overlap between the dummy gate and the metal silicide along a sidewall and a portion of the top of the metal silicide, removing an unreacted portion of the metal layer which has not formed the metal silicide from the top and the sidewall of the dummy gate, depositing an insulator layer in direct contact with the metal silicide and a sidewall of the dummy gate, replacing the dummy gate with a metal gate, forming a gate cap above and in direct contact with the metal gate, and forming a gate cap sidewall spacer in direct contact with a side of the gate cap and above and in direct contact with a portion of the insulator layer.

According to another embodiment, a structure of forming a field effect transistor is provided. The structure of forming a field effect transistor may include forming a metal silicide source drain region located in a portion of a fin on either side of a metal gate, the metal silicide source drain partially extends under the metal gate, a vertical side of the metal silicide source drain region is substantially under the gate, shortening a channel region, a gate cap above the metal gate, wherein sidewalls of the gate cap are substantially aligned with sidewalls of the metal gate, an insulator layer above the metal silicide source drain and in direct contact with a sidewall of the metal gate, and a gate cap spacer directly on the gate space and vertically coplanar with the gate cap.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which:

FIG. 1 is a cross-sectional view of a semiconductor structure depicting a plurality of fins, according to an exemplary embodiment.

FIG. 2 is a cross-sectional view of the semiconductor structure along section line A-A, according to FIG. 1;

FIG. 3 is a cross-sectional view of the semiconductor structure along section line B-B, according to FIG. 1;

FIG. 4 is a cross-sectional view of the semiconductor structure depicting the formation of a plurality of gates;

FIG. 5 is a cross-sectional view of the semiconductor structure along section line A-A, according to FIG. 4;

FIG. 6 is a cross-sectional view of the semiconductor structure along section line B-B, according to FIG. 4;

FIG. 7 is a cross-sectional view of the semiconductor structure depicting the formation of a source drain region of the fin;

FIG. 8 is a cross-sectional view of the semiconductor structure along section line A-A, according to FIG. 7;

FIG. 9 is a cross-sectional view of the semiconductor structure along section line B-B, according to FIG. 7;

FIG. 13 is a cross-sectional view of the semiconductor structure depicting a replacement of the dummy gate;

FIG. 14 is a cross-sectional view of the semiconductor structure along section line A-A, according to FIG. 13;

FIG. 15 is a cross-sectional view of the semiconductor structure along section line B-B, according to FIG. 13;

FIG. 16 is a cross-sectional view of the semiconductor structure depicting a partial recess of the middle of line insulator;

FIG. 17 is a cross-sectional view of the semiconductor structure along section line A-A, according to FIG. 16;

FIG. 18 is a cross-sectional view of the semiconductor structure along section line B-B, according to FIG. 16;

FIG. 19 is a cross-sectional view of the semiconductor structure depicting the formation of a gate cap spacer;

FIG. 20 is a cross-sectional view of the semiconductor structure along section line A-A, according to FIG. 19;

FIG. 21 is a cross-sectional view of the semiconductor structure along section line B-B, according to FIG. 19;

FIG. 22 is a cross-sectional view of the semiconductor structure depicting a partial removal of the middle of line spacer;

FIG. 23 is a cross-sectional view of the semiconductor structure along section line A-A, according to FIG. 22;

FIG. 24 is a cross-sectional view of the semiconductor structure along section line B-B, according to FIG. 22;

FIG. 25 is a cross-sectional view of the semiconductor structure depicting the formation of a metal layer;

FIG. 26 is a cross-sectional view of the semiconductor structure along section line A-A, according to FIG. 25; and FIG. 27 is a cross-sectional view of the semiconductor structure along section line B-B, according to FIG. 25.

Figures 10, 11, 12:
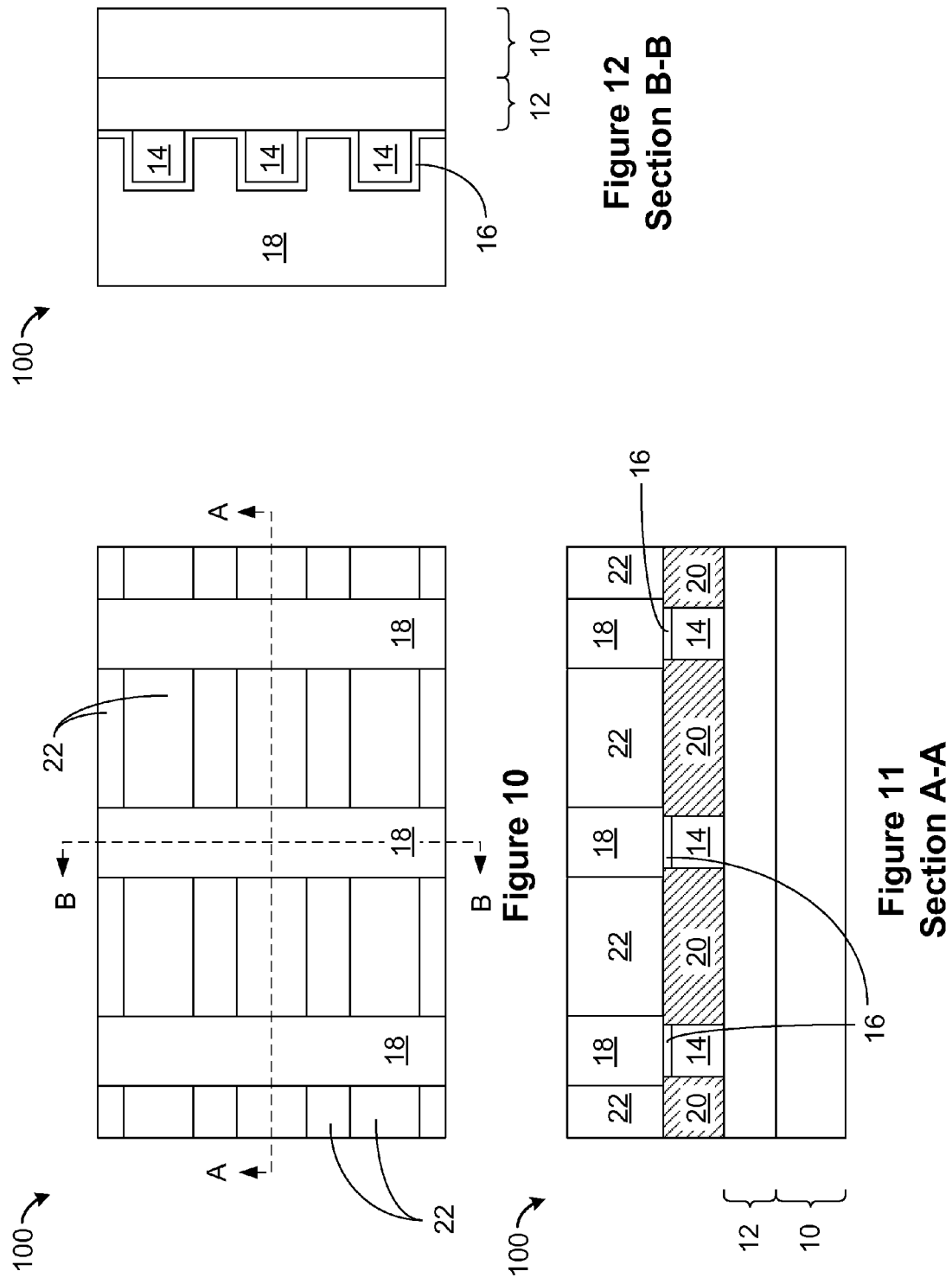
FIG. 10 is a cross-sectional view of the semiconductor structure depicting the formation of a middle of line insulator.
FIG. 11 is a cross-sectional view of the semiconductor structure along section line A-A, according to FIG. 10.
FIG. 12 is a cross-sectional view of the semiconductor structure along section line B-B, according to FIG. 10.

Elements of the figures are not necessarily to scale and are not intended to portray specific parameters of the invention. For clarity and ease of illustration, scale of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

A FinFET device may include a plurality of fins formed in a wafer; a gate covering a portion of the fins, where the portion of the fins covered by the gate serves as a channel region of the device and portions of the fins extending out from under the gate may serve as source and drain regions of the device. It should be noted that the invention disclosed below may be fabricated using either a replacement gate or gate last process flow, or a gate first process flow. A replacement gate process flow will be relied on for the description provided below.

In a replacement gate (RG) fabrication approach, a semiconductor substrate may be patterned and etched to form fins. Next, a dummy gate may be formed in a direction perpendicular to the length of the fins. For example, the dummy gate may be pattered and etched from a polysilicon layer. The dummy gates may then be surrounded by an inter-level dielectric. Later, the dummy gate may be removed, as by, for example, an anisotropic vertical etch process such as a reactive ion etch (RIE). This creates an opening where a metal gate may then be formed. Optionally, a gate dielectric may be configured below the metal gate.

The present invention generally relates to semiconductor manufacturing, and more particularly to fin field effect transistor devices (FinFET) with repeatable, controllable overlap between a gate and a source drain region. One way to control the overlap may include forming a metal source drain region before forming sidewall spacers along the gate. An embodiment by which to form a metal source drain region before forming sidewall spacers is described below with reference to FIGS. 1 to 27.

Referring now to FIGS. 1, 2 and 3, a semiconductor structure 100 (hereinafter "structure") is shown according to an exemplary embodiment. FIG. 2 is a cross section view of FIG. 1 taken along section line A-A. FIG. 3 is a cross section view of FIG. 1 taken along section line B-B.

The structure 100 may include a substrate. The substrate may include a bulk semiconductor or a layered semiconductor such as Si/SiGe, a silicon-on-insulator, or a SiGe-on-insulator. Bulk substrate materials may include undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. A semiconductor-on-insulator (SOI) substrate is illustrated in the figures and is relied upon for the corresponding discussion. The SOI substrate of the present example includes a base substrate 10, a buried insulator layer or buried oxide layer 12 (hereinafter "buried insulator layer"), and a top semiconductor layer which has been patterned to form a fin 14.

The base substrate 10 may be made from any of several known semiconductor materials such as, for example, a bulk silicon substrate. Other non-limiting examples include silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically the base substrate 10 may be approximately, but is not limited to, several hundred microns thick. For example, the base substrate 10 may include a thickness ranging from 0.5 mm to about 1.5 mm.

The buried insulator layer 12 may be formed from any of several dielectric materials. Non-limiting examples include, for example, oxides, nitrides and oxynitrides of silicon. Oxides, nitrides and oxynitrides of other elements are also envisioned. In addition, the buried insulator layer 12 may include crystalline or non-crystalline dielectric material. Moreover, the buried insulator layer 12 may be formed using any of several methods. Non-limiting examples include ion implantation methods, thermal or plasma oxidation or nitridation methods, chemical vapor deposition methods and physical vapor deposition methods. In an embodiment, the buried insulator layer 12 may be about 200 nm thick. Alternatively, the buried insulator layer 12 may include a thickness ranging from about 10 nm to about 500 nm. In an alternate embodiment where the substrate may be a bulk semiconductor, the buried insulator layer 12 may be replaced with a shallow trench isolation process.

The fin 14 which has been formed in or from the top semiconductor layer of the SOI substrate may include any of the several semiconductor materials included in the base substrate 10. In general, the base substrate 10 and the top semiconductor layer may include either identical or different semiconducting materials with respect to chemical composition, dopant concentration and crystallographic orientation. In an embodiment of the present invention, the base substrate 10 and the top semiconductor layer include semiconducting materials that include at least different crystallographic orientations. Typically the base substrate 10 or the top semiconductor layer include a {110} crystallographic orientation and the other of the base substrate 10 or the top semiconductor layer includes a {100} crystallographic orientation. Typically, the top semiconductor layer includes a thickness ranging from about 5 nm to about 100 nm, and ranges there between. Methods for making the top semiconductor layer are well known in the art. Non-limiting examples include SIMOX (Separation by Implantation of Oxygen), wafer bonding, and ELTRAN® (Epitaxial Layer TRANsfer).

The fin 14 may be formed from the top semiconductor layer using known photolithography and etch processes. In an exemplary embodiment, the fin 14 may be formed using a sidewall image transfer (SIT) technique. In an embodiment in which the fin 14 may be formed from a bulk semiconductor substrate, the fin 14 may be isolated from one another by regions of dielectric material. It should be noted that, while the embodiment depicted in the figures includes three fins 14, any number of fins may be formed from the top semiconductor layer. In an embodiment, the fin 14 may have a vertical thickness, or height, above the buried insulator layer 12 of about 30 nm, and a width of about 5 nm to 10 nm, and ranges there between.

A dielectric layer 16 may be formed directly on the exposed top surfaces of the structure 100, according to an exemplary embodiment. The dielectric layer 16 may be made from an insulator material such as an oxide, nitride, oxynitride, silicon carbon oxynitride, silicon boron oxynitride, low-k dielectric, or any combination thereof. The dielectric layer 16 may be deposited using typical deposition techniques, for example, atomic layer deposition (ALD), molecular layer deposition (MLD), chemical vapor deposition (CVD), physical vapor deposition (PVD), and spin on techniques. The dielectric layer 16 may be formed over the fin 14 and the exposed portion of the buried insulator layer 12. In an embodiment, the dielectric layer 16 may include one or more layers. In an embodiment, the dielectric layer 16 may have a vertical thickness, or height, about 1 nm to 5 nm, and ranges there between.

A dummy gate 18 may be formed over a portion of and perpendicular to the length of the fin 14, as shown in FIGS. 4, 5 and 6. FIG. 5 is a cross section view of FIG. 4 taken along section line A-A. FIG. 6 is a cross section view of FIG. 4 taken along section line B-B. The portion of the fin 14 covered by the dummy gate 18 may be referred to as a channel region. The exposed portion remaining after the formation of the dummy gate 18 of the fin 14 may be referred to as a source drain region. In many instances, the source drain region may extend between adjacent dummy gates 18.

The formation of the dummy gate 18 may begin with a sacrificial layer. In an embodiment, the sacrificial layer may have a vertical thickness, or height, above the dielectric layer 16 ranging from about 80 nm to about 150 nm. It should be noted that the vertical thickness of the sacrificial layer may correspond to the height of the dummy gate 18, which may be subsequently patterned from the sacrificial layer. The dummy gate 18 may then be patterned from the sacrificial layer by any lithography technique known in the art. It should be noted that, while the embodiment depicted in the figure includes three dummy gates 18, any number of dummy gates 18 may be formed on the structure 100.

The dummy gate 18 may be made from an insulator material such as a nitride, an oxide, oxynitride or any combination thereof. The dummy gate 18 may be deposited using typical deposition techniques, for example, atomic layer deposition (ALD), molecular layer deposition (MLD), chemical vapor deposition (CVD), physical vapor deposition (PVD), and spin on techniques. In an embodiment, the dummy gate 18 may include one or more layers. The dummy gate 18 may be polished using a chemical mechanical polishing (CMP) technique until a top surface of dummy gate 18 is substantially flat.

Subsequently, a portion of the dielectric layer 16 may be removed. More specifically, the portion of the dielectric layer 16 which is not covered by the dummy gate 18 may be removed to expose the source drain regions of the fin 14. The portions of the dielectric layer 16 may be removed by any means of any etching technique known in the art including, but not limited to, a reactive ion etching (RIE) technique or a wet etch technique. In an alternate embodiment, the portion of the dielectric layer 16 which is removed may be removed during the process of forming and patterning the dummy gate 18.

FIGS. 7, 8 and 9 illustrates the forming of metal or silicide source drain regions, according to an exemplary embodiment. FIG. 8 is a cross section view of FIG. 7 taken along section line A-A. FIG. 9 is a cross section view of FIG. 7 taken along section line B-B. The source drain region of the fin 14, may be converted to a silicide 20. It should be noted that silicide 20 may alternatively referred to as a metal silicide.

First, a metal layer may be deposited uniformly over the entire structure 100. The metal layer may be formed using conventional deposition techniques including, but not limited to: chemical vapor deposition (CVD), plasma-assisted CVD, high-density chemical vapor deposition (HDCVD), plating, sputtering, evaporation, and chemical solution deposition. The deposition of the metal layer may be continued until an initial thickness about 2 nm to about 10 nm is produced. The metal layer may contain a metal or a metal alloy that is capable of reacting with the exposed silicon of the top layer of structure 100 to form a silicide. In an embodiment, the metal layer may include a nickel-platinum (NiPt) alloy. The metal layer may include a nickel concentration ranging from about 70 to about 95 atomic percent.

Preferably, nickel may be present in the alloy in an amount ranging from about 90 to about 95 atomic percent. The remainder percentage may consist of platinum and another metal. In an embodiment, the metal layer may include NiPd, NiRe, Ti, TiTa, TiNb, or Co.

Next, the structure 100 may be annealed at a relatively low annealing temperature, ranging from about 150° C. to about 700° C., using either a continuous heating regime or various ramp and soak heating cycles, for a duration ranging from about 1 millisecond to about 1000 seconds. More preferably, the annealing step may be carried out at an annealing temperature ranging from about 200° C. to about 400° C. and for a duration ranging from about 1 millisecond to about 5 seconds. Most preferably, the annealing step may be carried out at an annealing temperature ranging from about 250° C. to about 350° C. and for a duration from about 5 seconds to about 100 seconds. In an embodiment, the annealing step may be initiated by raising the surrounding temperature of the entire structure 100 from ambient temperature to the desired annealing temperature at a ramp rate from about 1° C./second to about 35° C./second, more preferably from about 5° C./second to about 25° C./second, and most preferably from about 10° C./second to about 20° C./second. Further, it is preferred that the annealing step may be terminated by lowering the surrounding temperature of the entire structure 100 to below 100° C. within a time period from about 10 seconds to about 1000 seconds.

The annealing technique, as described above, may be generally referred to as a low-temperature rapid thermal annealing (RTA) step. As a result of the low-temperature RTA technique, nickel contained in the metal layer reacts with a semiconductor material, such as, silicon, present in the source drain region of the fin 14 to form the silicide 20. The silicide 20 may contain NiInGaAs, formed by the reaction between nickel and silicon at the relatively low annealing temperature. The metal layer may be of a sufficient thickness to convert substantially all of the source drain region of the fin 14 to form silicide 20. Forming the silicide 20 may include converting an entire thickness of the source drain region of the fin 14 to a metal silicide source drain. In an embodiment, where the fin 14 is approximately 10 nn wide, the silicide 20 may be 10 nm to 20 nm.

During the annealing technique as described above, the metal layer may react with the source drain region of the fin 14 and may not react with the dummy gate 18. In an embodiment, the dummy gate 18 material may be a nitride or an oxide which may not react with the metal layer during the annealing step. Additionally, the exposed areas of the buried insulator layer 12 may not react with the metal during the annealing step. Finally, any remaining unreacted portions of the metal layer may be etched and selectively removed from above the dummy gate 18 and above the buried insulator layer 12.

It should be noted that the silicide 20 may, in some cases, extend beneath the dummy gate 18, as shown in the figures. A boundary of the silicide 20 may extend an entire height of the fin 14 and may be substantially vertical. The extension of the silicide 20 under the dummy gate 18 may have the advantage of reducing the resistance between the source drain regions of the fin 14.

An insulator layer 22 may be formed directly on the exposed top surfaces of the structure 100, as shown in FIGS. 10, 11 and 12. FIG. 11 is a cross section view of FIG. 10 taken along section line A-A. FIG. 12 is a cross section view of FIG. 10 taken along section line B-B. The insulator layer 22 may cover the exposed portions of the silicide 20 and the buried insulator layer 12 between the dummy gates 18. The insulator layer 22 may be made from an insulator material such as an oxide, nitride, oxynitride, silicon carbon oxynitride, silicon boron oxynitride, low-k dielectric, or any combination thereof. The insulator layer 22 may be deposited using typical deposition techniques, for example, atomic layer deposition (ALD), molecular layer deposition (MLD), chemical vapor deposition (CVD), physical vapor deposition (PVD), and spin on techniques. The insulator layer 22 may be polished using a chemical mechanical polishing (CMP) technique until a top surface of the insulator layer 22 is substantially coplanar with a top surface of the dummy gate 18, as illustrated.

The dummy gate 18 may be replaced with a gate dielectric 24, a metal gate 26 and a gate cap 28, as shown in FIGS. 13, 14 and 15. FIG. 14 is a cross section view of FIG. 13 taken along section line A-A. FIG. 15 is a cross section view of FIG. 13 taken along section line B-B.

First, the dummy gate 18 may be removed by any means of any etching technique known in the art including, but not limited to, a reactive ion etching (RIE) technique or a wet etch technique. More specifically, the dummy gate 18 may be removed selective to the insulator layer 22 and the silicide 20, to expose the fin 14 to create an opening. Next, after the dummy gate 18 is removed, the gate dielectric 24 may be conformally deposited within the opening and on top of the fin 14, on top of the silicide 20 and along a vertical side wall of the insulator layer 22. A sidewall of the opening is the insulator layer and a bottom of the opening is coplanar with a top of the channel region of the semiconductor fin and a bottom edge of the opening overlaps with the metal silicide source drain which extends beneath the opening.

The gate dielectric 24 may be made from any know gate dielectric material, such as silicon dioxide, silicon nitride, hafnium oxide, titanium oxide, zirconium oxide or other oxide. In a preferred embodiment, the gate dielectric 24 may be made from a high-k dielectric. The gate dielectric 24 may be deposited using typical deposition techniques, for example, atomic layer deposition (ALD), molecular layer deposition (MLD), chemical vapor deposition (CVD), physical vapor deposition (PVD), and spin on techniques. In an embodiment, the gate dielectric 24 may include one or more layers. In an embodiment, the gate dielectric 24 may have a thickness, or height, ranging from about 1 nm to 5 nm.

The metal gate 26 may next be deposited within the opening of top of the gate dielectric 24 and on top of the entire structure 100. The metal gate 26 may be deposited using conventional deposition techniques including, but not limited to: atomic layer deposition (ALD), chemical vapor deposition (CVD), molecular beam deposition (MBD), pulsed laser deposition (PLD), or liquid sourced misted chemical deposition (LSMCD). The metal gate 26 may be made from any known gate metal, e.g. Al, W, Cu, Zr, Ta, Hf, Ti, Ru, Pa, metal oxide, metal carbide, metal nitride, transition metal aluminides (e.g. Ti3Al, ZrAl), TaC, TiC, TaMgC, and any combination of those materials. The deposition of the metal may be continued until an initial thickness about 2 nm to 30 nm is produced. The metal may be polished using a chemical mechanical polishing (CMP) technique until a top surface of the metal gate 26 is substantially coplanar with a top surface of the insulator layer 22, as illustrated.

Finally, the gate dielectric 24 and the metal gate 26 may be partially recessed and the gate cap 28 may be deposited. In an embodiment, the gate cap 28 may include silicon nitride (Si3N4), SiBCN, SiOC or any combination of these materials, deposited using a chemical vapor deposition technique. In an embodiment, the gate cap 28 may have a thickness ranging from about 10 nm to about 50 nm and ranges there between, although a thickness less than 10 nm and greater than 50 nm may be acceptable.

An upper portion of the insulator layer 22 may be partially removed, according to one exemplary embodiment, as shown in FIGS. 16, 17 and 18. FIG. 17 is a cross section view of FIG. 16 taken along section line A-A. FIG. 18 is a cross section view of FIG. 16 taken along section line B-B. The upper portion of the insulator layer 22 may be partially removed by any means of any etching technique known in the art including, but not limited to, a reactive ion etching (RIE) technique or a wet etch technique. More specifically, the upper portion of the insulator layer 22 may be removed until a top of the lower portion of the insulator layer 22 is substantially flush with a bottom of the gate cap 28, such that a side of the gate cap 28 is exposed.

A gate cap spacer 30 may be formed on the side of the gate cap 28, partially covering a portion of the lower portion of the insulator layer 22, according to FIGS. 19, 20 and 21. FIG. 20 is a cross section view of FIG. 19 taken along section line A-A. FIG. 21 is a cross section view of FIG. 19 taken along section line B-B.

The gate cap spacer 30 may be formed directly on the portion of the lower portion of the insulator layer 22, according to an exemplary embodiment. The gate cap spacer 30 may be directly adjacent to the gate cap 28. The gate cap spacer 30 may be made from an insulator material such as a nitride, an oxide, an oxynitride, a silicon carbon oxynitride, silicon boron oxynitride, low-k dielectric, or any combination thereof. The gate cap spacer 30 may be deposited using typical deposition techniques, for example, atomic layer deposition (ALD), molecular layer deposition (MLD), chemical vapor deposition (CVD), physical vapor deposition (PVD), and spin on techniques. The gate cap spacer 30 may be partially removed by any means of any etching technique known in the art including, but not limited to, a reactive ion etching (RIE) technique or a wet etch technique. More specifically, the gate cap spacer 30 may be removed selective to the gate cap 28 and to partially expose the lower portion of the insulator layer 22 to create an opening.

A center portion of the lower portion of the insulator layer 22 may be removed and a side portion of the lower portion of the insulator layer 22 may remain, forming a gate sidewall spacer, as shown in FIGS. 22, 23 and 24. The gate sidewall spacer may be self-aligned relative to the gate cap spacer 30. FIG. 23 is a cross section view of FIG. 22 taken along section line A-A. FIG. 24 is a cross section view of FIG. 22 taken along section line B-B.

The center portion of the lower portion of the insulator layer 22 may be partially removed by any means of any etching technique known in the art including, but not limited to, a reactive ion etching (RIE) technique or a wet etch technique. More specifically, the center portion of the lower portion of the insulator layer 22 may be removed selective to the gate cap spacer 30 and to partially expose a top of the silicide 20 and a top of the buried insulator layer 12 to create an expanded opening. The expanded opening may be bordered on the bottom by the silicide 20 and the buried insulator layer 12. The expanded opening may be bordered on a vertical side by the gate cap spacer 30 and the side portion of the insulator layer 22.

A metal contact 32 may be deposited in the expanded opening, as shown in FIGS. 25, 26 and 27, according to an exemplary embodiment. FIG. 26 is a cross section view of FIG. 25 taken along section line A-A. FIG. 27 is a cross section view of FIG. 25 taken along section line B-B.

The metal contact 32 may be deposited in the expanded opening using conventional deposition techniques including, but not limited to: atomic layer deposition (ALD), chemical vapor deposition (CVD), molecular beam deposition (MBD), pulsed laser deposition (PLD), or liquid sourced misted chemical deposition (LSMCD). The metal contact 32 may then be may be polished using a chemical mechanical polishing (CMP) technique until a top surface of the metal contact 32 is substantially coplanar with a top surface of the gate cap 28 and the gate cap spacer 30. In a preferred embodiment, the metal contact 32 may be partially recessed until a top surface of the metal contact 32 is substantially coplanar with a top surface of both the insulator layer 22 and the metal gate 26. The metal contact 32 may be made from any known metal, e.g. Al, W, Cu, Zr, Ta, Hf, Ti, Ru, Pa, metal oxide, metal carbide, metal nitride, transition metal aluminides (e.g. Ti3Al, ZrAl), TaC, TiC, TaMgC, and any combination of those materials. The metal contact 32 may have one or more layers. In an embodiment, the metal contact 32 may have a bottom layer of Ti or TiN and a top layer of T or Cu. The metal contact 32 may be bordered on the bottom by the silicide 20 and the buried insulator layer 12. The metal contact 32 may be bordered on a vertical edge by a vertical edge of the side portion of the insulator layer 22. The metal contact 32 may have a top which is substantially flush with the top of the side portion of the insulator layer 22 and a bottom of the gate cap spacer 30.

Structure 100 may be referred to as a Schottky barrier device with self-aligned Schottky barrier extension. The Schottky barrier device may have improved FET performance over traditional methods of fabrication. The resulting abrupt channel between the silicide 20 and the metal gate 26 may be a more controllable Schottky source drain due to the above method of controlling the overlap and thus, the channel length between the silicide 20 and the metal gate 26. The fabrication method described above does not have a sidewall spacer between the silicide 20 and the metal gate 26, resulting in a shortened channel length, and may be referred to as a spacerless Schottky barrier device. By controlling a thickness of the metal layer and the dimensions of the fin 14, this allows control of the metal silicide source drain overlap with the dummy gate 18.

It may be noted that not all advantages of the present invention are include above.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of forming a field effect transistor comprising:
   forming a dummy gate perpendicular to and covering a channel region of a semiconductor fin, such that a source drain region of the semiconductor fin remains uncovered;

depositing a metal layer above and in direct contact with a sidewall of the dummy gate, and above and in direct contact with a top and a sidewall of the source drain region;

forming a metal silicide source drain in the source drain region by annealing the metal layer and the semiconductor fin, such that the metal silicide source drain overlaps the dummy gate;

depositing an insulator layer directly on the metal silicide source drain, directly adjacent to the dummy gate;

removing the dummy gate and creating an opening, such that a sidewall of the opening is the insulator layer and a bottom of the opening is coplanar with a top of the channel region of the semiconductor fin and a bottom edge of the opening overlaps with the metal silicide source drain which extends beneath the opening;

conformally depositing a gate dielectric in direct contact with a bottom and a lower portion of the sidewall of the opening;

forming a metal gate in the opening in direct contact with the gate dielectric such that an upper portion of the sidewall of the opening remains at a top of the gate dielectric and a top of the metal gate;

forming a gate cap in the upper portion of the opening, in direct contact with the top of the gate dielectric and the top of the metal gate;

forming a gate cap spacer above the insulator layer and adjacent to the gate cap; and removing a portion of the insulator layer, such that a remaining portion of the insulator layer is adjacent to the metal gate and forms a gate sidewall spacer.

2. The method of claim 1, wherein the dummy gate comprises a nitride.

3. The method of claim 1, wherein forming the metal silicide source drain comprises:

converting an entire thickness of the source drain region to a metal silicide source drain.

4. The method of claim 1, further comprising:

controlling the overlap between the metal silicide source drain region and the dummy gate by controlling a thickness of the metal layer.

5. The method of claim 1, further comprises:

forming a metal contact in direct contact with a top surface of the metal silicide source drain, such that a vertical edge of the metal contact is in direct contact with a vertical edge of the gate sidewall spacer.

6. The method of claim 1, wherein depositing the metal layer above and in direct contact with the sidewall of the dummy gate comprises:

depositing the metal layer above and in direct contact with the sidewall of the dummy gate without forming a sidewall spacer along a sidewall of the dummy gate.

7. A method of forming a field effect transistor comprising:

forming a dummy gate perpendicular to and covering a channel region of a silicon fin, such that a source drain region of the silicon fin remains uncovered;

depositing a metal layer in direct contact with a top and a sidewall of the dummy gate, and in direct contact with a top and a sidewall of the source drain region;

annealing the metal layer and the source drain region, causing silicon from the source drain region to react with the metal layer, forming a metal silicide source drain, such that a portion of the metal silicide source drain extends beneath the dummy gate creating an overlap between the dummy gate and the metal silicide source drain along a sidewall and a portion of the top of the metal silicide source drain;

removing an unreacted portion of the metal layer which has not formed the metal silicide source drain from the top and the sidewall of the dummy gate;

depositing an insulator layer in direct contact with the metal silicide source drain and a sidewall of the dummy gate;

replacing the dummy gate with a metal gate;

forming a gate cap above and in direct contact with the metal gate; and forming a gate cap sidewall spacer in direct contact with a side of the gate cap and above and in direct contact with a portion of the insulator layer.

8. The method of claim 7, further comprising:

removing a portion of the insulator layer, such that a remaining portion of insulator layer is in direct contact with a sidewall of the metal gate and forms a gate sidewall spacer self-aligned to the gate cap sidewall spacer.

9. The method of claim 7, wherein the dummy gate is a nitride.

10. The method of claim 8, further comprising:

forming a metal contact directly over a top side and a vertical side of the metal silicide source drain, such that a vertical edge of the metal contact is in direct contact to a vertical edge of the gate sidewall spacer.

11. The method of claim 7, wherein forming the metal silicide source drain comprises:

converting an entire thickness of the source drain region to the metal silicide source drain.

12. The method of claim 7, further comprising:

controlling the overlap between the metal silicide source drain region and the dummy gate by controlling a thickness of the metal layer.

13. The method of claim 7, wherein replacing the dummy gate with the metal gate and forming the gate cap comprises:

removing the dummy gate and creating an opening, such that a sidewall of the opening is the insulator layer and a bottom of the opening is coplanar with a top of the channel region of the fin and a bottom edge of the opening overlaps with the metal silicide source drain which extends beneath the opening;

conformally depositing a gate dielectric in direct contact with a bottom and a lower portion of a side of the opening;

forming the metal gate in the opening in direct contact with the gate dielectric such that an upper portion of the side of the opening remains at a top of the gate dielectric and a top of the metal gate; and forming the gate cap in the upper portion of the opening, in direct contact with the top of the gate dielectric and the top of the metal gate.

14. A method of forming a field effect transistor comprising:

forming a dummy gate perpendicular to and covering a channel region of a semiconductor fin, such that a source drain region of the semiconductor fin remains uncovered;

depositing a metal layer above and in direct contact with a sidewall of the dummy gate, and above and in direct contact with a top and a sidewall of the source drain region, without forming a sidewall spacer along a sidewall of the dummy gate; and forming a metal silicide source drain in the source drain region by annealing the metal layer and the semiconductor fin, such that the metal silicide source drain overlaps the dummy gate.

15. The method of claim 14, wherein the dummy gate comprises a nitride.

16. The method of claim 14, wherein forming the metal silicide source drain comprises:
converting an entire thickness of the source drain region to a metal silicide source drain.

17. The method of claim 14, further comprising:
controlling the overlap between the metal silicide source drain region and the dummy gate by controlling a thickness of the metal layer.

18. The method of claim 14, further comprising:
depositing an insulator layer directly on the metal silicide source drain, directly adjacent to the dummy gate;
replacing the dummy gate with a metal gate;
forming a gate cap spacer above and in direct contact with the metal gate; and
removing a portion of the insulator layer, such that a remaining portion of the insulator layer is directly adjacent to the metal gate and forms a gate sidewall spacer.

19. The method of claim 14, further comprises:
forming a metal contact in direct contact with a top surface of the metal silicide source drain, such that a vertical edge of the metal contact is in direct contact with a vertical edge of the gate sidewall spacer.

* * * * *